(12) United States Patent
Kinoshita et al.

(10) Patent No.: US 10,069,004 B2
(45) Date of Patent: Sep. 4, 2018

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Akimasa Kinoshita, Matsumoto (JP); Yasuyuki Hoshi, Matsumoto (JP); Yuichi Harada, Matsumoto (JP); Yasuhiko Oonishi, Matsumoto (JP)

(73) Assignee: FUJI ELECTRIC CO., LTD., Kawsaki-shi, Kanagawa (JP)

( * ) Notice: Subject to any disclaimer, the term of this patent is extended or adjusted under 35 U.S.C. 154(b) by 62 days.

(21) Appl. No.: 15/201,236

(22) Filed: Jul. 1, 2016

(65) Prior Publication Data
US 2016/0315187 A1 Oct. 27, 2016

Related U.S. Application Data

(63) Continuation of application No. PCT/JP2015/070337, filed on Jul. 15, 2015.

(30) Foreign Application Priority Data

Jul. 23, 2014 (JP) .................................. 2014-150257

(51) Int. Cl.
*H01L 31/0256* (2006.01)
*H01L 21/20* (2006.01)
(Continued)

(52) U.S. Cl.
CPC ........ *H01L 29/7811* (2013.01); *H01L 21/761* (2013.01); *H01L 29/0615* (2013.01);
(Continued)

(58) Field of Classification Search
CPC ............... H01L 29/7811; H01L 29/045; H01L 29/0623; H01L 29/0638; H01L 29/1608;
(Continued)

(56) References Cited

U.S. PATENT DOCUMENTS 8,618,557 B2 * 12/2013 Yoshikawa ......... H01L 29/0653
257/135
2010/0314629 A1 * 12/2010 Tarui ................... H01L 29/0615
257/77

(Continued)

FOREIGN PATENT DOCUMENTS

| JP | 2012-074441 A | 4/2012 |
| JP | 2012-156154 A | 8/2012 |
| JP | 2013-232564 A | 11/2013 |

OTHER PUBLICATIONS

Rottner, K., et al, "SiC power devices for high voltage applications", Mater. Sci. Engineer. B, vol. 61-62, p. 330-338, Jul. 30, 1999.
(Continued)

*Primary Examiner* — Kevin M Picardat
(74) *Attorney, Agent, or Firm* — Rabin & Berdo, P.C.

(57) ABSTRACT

A semiconductor device of an embodiment includes a $p^+$-type region selectively disposed in a surface of an n-type silicon carbide epitaxial layer disposed on an $n^+$-type silicon carbide substrate, an element structure that includes a source electrode and a $p^+$-type region that form a metal-semiconductor junction on the n-type silicon carbide epitaxial layer, a $p^-$-type region and another $p^-$-type region that surround the periphery of the element structure, and an $n^+$-type channel stopper region that surrounds the periphery of the $p^-$-type regions so that the n-type silicon carbide epitaxial layer is therebetween. The $n^+$-type channel stopper region has a second $n^+$-type channel stopper region whose impurity concentration is high, and a first $n^+$-type channel stopper region that encompasses the second $n^+$-type channel stopper (Continued)

region and whose impurity concentration is lower than that of the second n⁺-type channel stopper region.

8 Claims, 6 Drawing Sheets

(51) Int. Cl.
*H01L 29/78* (2006.01)
*H01L 21/761* (2006.01)
*H01L 29/06* (2006.01)
*H01L 29/66* (2006.01)
*H01L 29/04* (2006.01)
*H01L 29/16* (2006.01)

(52) U.S. Cl.
CPC ...... *H01L 29/0623* (2013.01); *H01L 29/0638* (2013.01); *H01L 29/66068* (2013.01); *H01L 29/045* (2013.01); *H01L 29/1608* (2013.01)

(58) Field of Classification Search
CPC ............. H01L 29/66068; H01L 21/761; H01L 21/02529
USPC ............. 257/76, 77, 105; 438/479, 481, 931
See application file for complete search history.

(56) References Cited

U.S. PATENT DOCUMENTS

| | | | |
|---|---|---|---|
| 2012/0074491 A1 | 3/2012 | Ohta et al. | |
| 2013/0001703 A1* | 1/2013 | Sugawara | H01L 29/0661 257/378 |
| 2014/0361312 A1* | 12/2014 | Yoshikawa | H01L 29/41766 257/76 |
| 2015/0115285 A1 | 4/2015 | Kinoshita et al. | |
| 2015/0255290 A1* | 9/2015 | Masuoka | H01L 29/861 438/514 |
| 2016/0181373 A1* | 6/2016 | Masuda | H01L 29/66068 257/77 |

OTHER PUBLICATIONS

Tsuji, T., et al, "Analyses of high leakage currents in Al+ implanted 4H SiC pn diodes caused by threading screw dislocations", Mater. Sci. Forum vols. 645-648 (2010) p. 913-916.

* cited by examiner

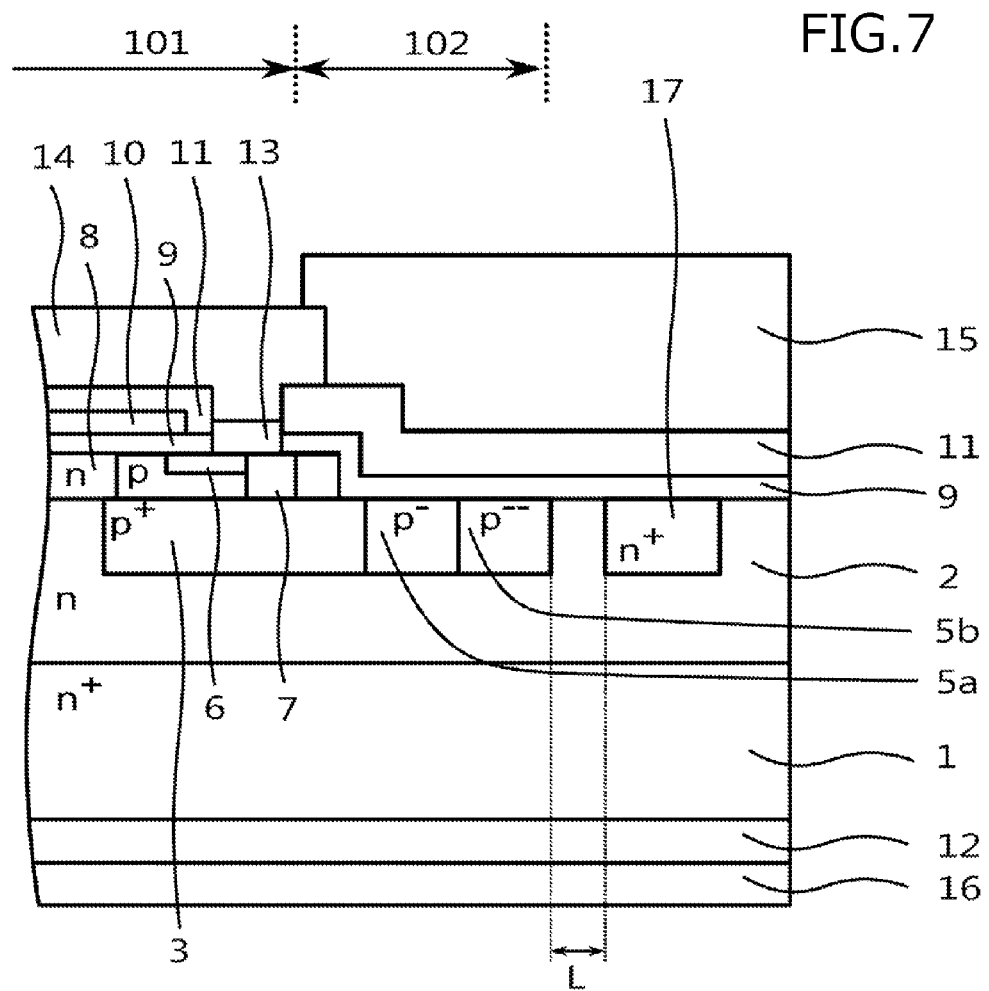

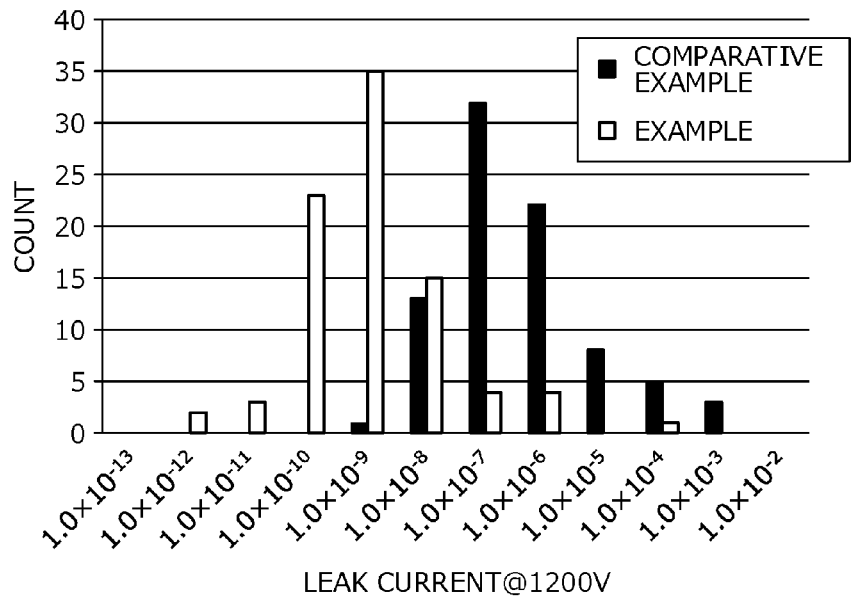
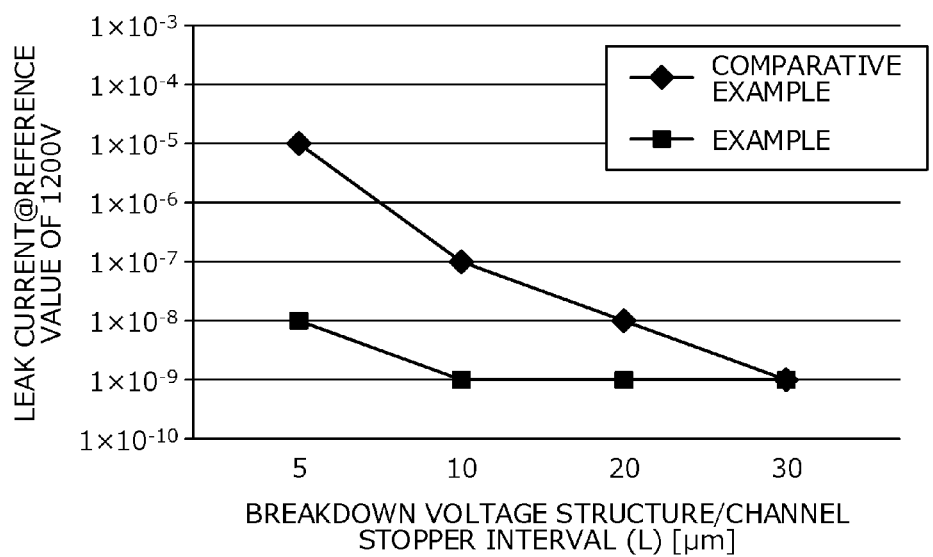

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2015/070337 filed on Jul. 15, 2015 which claims priority from a Japanese Patent Application No. 2014-150257 filed on Jul. 23, 2014, the contents of which are incorporated herein by reference.

BACKGROUND OF THE INVENTION

1. Field of the Invention

Embodiments of the invention related to a semiconductor device and method of manufacturing a semiconductor device.

2. Description of the Related Art

Commonly known semiconductor devices use a semiconductor material whose band gap is wider than that of silicon (Si) (hereinafter, "wide band gap semiconductor") such as silicon carbide (SiC). When a high-voltage device is manufactured using a silicon carbide semiconductor and high voltage is applied, the electric field concentrates at an end of an element. Therefore, a breakdown voltage structure needs to be formed to mitigate the electric field. The surface of the breakdown voltage structure is generally coated with a protective film such as an oxide film. However, an interface state is formed at the interface between the semiconductor and the protective film and when high voltage is applied, a thin depletion layer spreads in the surface of the semiconductor toward the chip end under the influence of the interface state. The depletion layer reaches the chip end where the crystalline structure is in disarray from dicing and causes leak current. To prevent this phenomenon, a region referred to as a "channel stopper" and having a high impurity concentration is generally formed around the device to thereby suppress the spreading of the depletion layer to reduce the leak current (see, for example, Rottner, K., et al, "SiC power devices for high voltage applications", Mater. Sci. Engineer. B, Vol. 61-62, p. 330-338, 1999).

In a silicon carbide semiconductor device, it is difficult to form a semiconductor region of an arbitrary conductivity type by diffusion and therefore, ion implantation is used. After the ion implantation, processing at a high temperature has to be further executed. Without this high temperature processing, the exchange with the atoms in the silicon carbide does not take place and no carrier is therefore generated and the region does not operate as a conductivity type semiconductor region.

When this high-temperature activation process is executed after the ion implantation of a high impurity concentration is executed, electrical properties are adversely affected consequent to a lattice defect present in the silicon carbide substrate (see, for example, Tsuji, T., et al, "Analyses of high leakage currents in Al+implanted 4H SiC pn diodes caused by threading screw dislocations", Mater. Sci. Forum Vols. 645-648 (2010) p. 913-916). When a channel stopper whose impurity concentration needs to be a high concentration is formed as a measure against the above, lattice defects are generated to be leak sources. In this case, the leak is increased when the depletion layer generated due to the interface state reaches the channel stopper.

SUMMARY OF THE INVENTION

According to one aspect of the present invention, a semiconductor device includes a semiconductor substrate of a first conductivity type and comprising a semiconductor having a band gap that is wider than that of silicon; a deposited semiconductor layer of the first conductivity type and deposited on a surface of the semiconductor substrate, the first deposited semiconductor layer comprising a semiconductor having a band gap that is wider than that of silicon and an impurity concentration that is lower than that of the semiconductor substrate; a first second-conductivity-type semiconductor region selectively disposed in a surface layer of an opposite side of the first deposited semiconductor layer with respect to a semiconductor substrate side of the first deposited semiconductor layer; an element structure that includes at least the first second-conductivity-type semiconductor region and a metal layer forming a metal-semiconductor junction on the first deposited semiconductor layer; a second second-conductivity-type semiconductor region that surrounds a periphery of the element structure; and a first conductivity type semiconductor region that surrounds a periphery of the second second-conductivity-type semiconductor region so that the first deposited semiconductor layer is therebetween. The first conductivity type semiconductor region has a first first-conductivity-type semiconductor region that encompasses a second first-conductivity-type semiconductor region of a high impurity concentration and separates the second first-conductivity-type semiconductor region and the first deposited semiconductor layer from each other. The first first-conductivity-type semiconductor region has an impurity concentration that is higher than that of the first deposited semiconductor layer and is at most 0.1 times the impurity concentration of the second first-conductivity-type semiconductor region.

In the semiconductor device, a width of the first first-conductivity-type semiconductor region separating the second second-conductivity-type semiconductor region and the first deposited semiconductor layer from each other is at least 0.1 μm.

In the semiconductor device, the metal film forms a Schottky junction with the first deposited semiconductor layer.

The semiconductor device further includes a second deposited semiconductor layer of a second conductivity type and selectively deposited on the first deposited semiconductor layer. The metal film forms an ohmic junction with the second deposited semiconductor layer.

In the semiconductor device, the element structure includes a base region of a second conductivity type and comprising a second deposited semiconductor layer of a second conductivity type, the base region covering a portion of the first second-conductivity-type semiconductor region and having an impurity concentration that is lower than that of the first second-conductivity-type semiconductor region; a source region of the first conductivity type and selectively disposed inside the base region; a well region of the first conductivity type and penetrating the base region in a depth direction so as to reach the first deposited semiconductor layer; a gate electrode that is disposed through a gate insulating film, on a surface of the base region, at a portion between the source region and the well region; and a source electrode that comprises the base region and the metal film that contacts the source region.

In the semiconductor device, the semiconductor substrate includes silicon carbide.

In the semiconductor device, a crystallographic plane of the semiconductor substrate is a plane parallel to a (000-1) plane or a plane inclined with respect to the (000-1) plane, at an angle that is at most 10 degrees.

According to another aspect of the present invention, a method of manufacturing a semiconductor device produces a semiconductor device that includes a semiconductor substrate of a first conductivity type and comprising a semiconductor having a band gap that is wider than that of silicon; a deposited semiconductor layer of the first conductivity type and deposited on a surface of the semiconductor substrate, the first deposited semiconductor layer comprising a semiconductor having a band gap that is wider than that of silicon and an impurity concentration that is lower than that of the semiconductor substrate; a first second-conductivity-type semiconductor region selectively disposed in a surface layer of an opposite side of the first deposited semiconductor layer with respect to a semiconductor substrate side of the first deposited semiconductor layer; an element structure that comprises at least the first second-conductivity-type semiconductor region and a metal layer forming a metal-semiconductor junction on the first deposited semiconductor layer; a second second-conductivity-type semiconductor region that surrounds a periphery of the element structure; and a first conductivity type semiconductor region that surrounds a periphery of the second second-conductivity-type semiconductor region so that the first deposited semiconductor layer is therebetween. The method includes depositing the first deposited semiconductor layer on the surface of the semiconductor substrate; selectively forming as the first conductivity type semiconductor region, a first first-conductivity-type channel stopper region that has an impurity concentration that is higher than that of the first deposited semiconductor layer, the first first-conductivity-type channel stopper region being formed in a surface layer of the first deposited semiconductor layer, at an outer side of a breakdown voltage structure unit that surrounds an active region that bears driving current; and selectively forming as the first conductivity type semiconductor region, a second first-conductivity-type channel stopper region that has an impurity concentration that is at least 10 times that of the first first-conductivity-type channel stopper region, the second first-conductivity-type channel stopper region being formed inside the first first-conductivity-type channel stopper region so as to be encompassed by the first first-conductivity-type channel stopper region.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is a cross-sectional view of a configuration of a comparative example of the silicon carbide semiconductor device according to the embodiment;

FIG. 8 is a chart of frequency distributions of a leak current value of an example and the comparative example; and FIG. 9 is a chart of mode values of leak current when an interval between a breakdown voltage structure and a channel stopper is varied for the example and the comparative example.

DETAILED DESCRIPTION OF THE INVENTION

Figure 1:
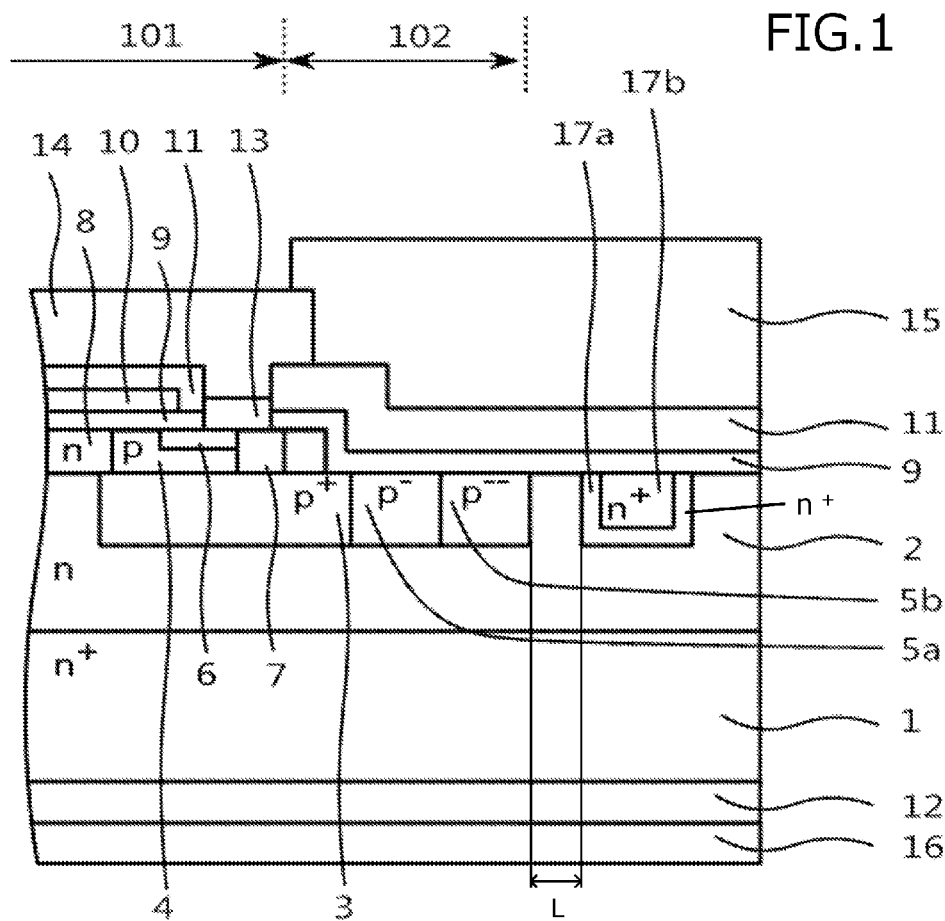
FIG. 1 is a cross-sectional view of a configuration of a silicon carbide semiconductor device according to an embodiment.

Preferred embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not repeatedly be described. Further, in the present description, when Miller indices are described, "−" means a bar added to an index immediately after the "−", and a negative index is expressed by prefixing "−" to the index.

The semiconductor device according to the present invention is configured using a semiconductor whose band gap is wider than that of silicon (a wide band gap semiconductor). In the embodiment, description will be given taking an example of a silicon carbide semiconductor device produced using, for example, silicon carbide (SiC) as the wide band gap semiconductor.

FIG. 1 is a cross-sectional view of a configuration of the silicon carbide semiconductor device according to an embodiment. As depicted in FIG. 1, the silicon carbide semiconductor device has an n-type silicon carbide epitaxial layer (a wide band gap deposited semiconductor layer) 2 deposited on a principal surface of an $n^+$-type silicon carbide substrate (a wide band gap semiconductor substrate) 1. Hereinafter, an epitaxial substrate formed by depositing the n-type silicon carbide epitaxial layer 2 on the $n^+$-type silicon carbide substrate 1 will be regarded as a silicon carbide semiconductor base substrate.

The $n^+$-type silicon carbide substrate 1 is a silicon carbide single crystal substrate in which, for example, nitrogen (N) is doped. The n-type silicon carbide epitaxial layer 2 is a low concentration n-type drift layer formed by doping, for example, nitrogen at an impurity concentration that is lower than that of the $n^+$-type silicon carbide substrate 1.

A back surface electrode 12 is disposed on the $n^+$-type silicon carbide substrate 1, in a surface on the opposite side the $n^+$-type silicon carbide substrate 1 with respect to an n-type silicon carbide epitaxial layer 2 side of the $n^+$-type silicon carbide substrate 1. The back surface electrode 12 constitutes a drain electrode. A back surface electrode pad 16 is disposed on a surface of the back surface electrode 12.

In an active region 101, a metal oxide semiconductor (MOS) insulated gate structure, which may be referred to in the present specification and claims as an element structure, based on forming an elemental unit of a semiconductor device, is formed on a front surface of the silicon carbide semiconductor base substrate. While in one embodiment, a metal oxide semiconductor insulated gate structure forms the element structure, other embodiments of element structures encompass any semiconductor insulated gate structures. The active region 101 is a region in which current flows in an ON state (bears driving current). For example, in the active region 101, a $p^+$-type region (a first second-conductivity-type semiconductor region, a base region) 3 is selectively disposed in a surface layer on the opposite side of the n-type silicon carbide epitaxial layer 2 (the front surface side of the silicon carbide semiconductor base substrate) with respect to an $n^+$-type silicon carbide substrate 1 side of the n-type silicon carbide epitaxial layer 2. The p+-type region 3 is doped with, for example, aluminum.

A p-type silicon carbide epitaxial layer (a p-type base layer, a second conductivity type base region) 4 is selectively deposited on the surfaces of the adjacent p+-type regions 3 and the surface of the n-type silicon carbide epitaxial layer 2 between the adjacent p+-type regions 3. The p-type base layer 4 is deposited only at the active region 101. The impurity concentration of the p-type base layer 4 is lower than the impurity concentration of the p+-type regions 3.

An n+ source region 6 that is disposed on the p-type base layer 4, is of a first conductivity type (n type) and has a high impurity concentration. A p+ contact region 7 of a second conductivity type (p type) has a high impurity concentration. The n+ source region 6 and the p+ contact region 7 are disposed in a portion counter to the p+-type regions 3 of the p-type base layer 4. The n+ source region 6 and the p+ contact region 7 are adjacent to each other. The p+ contact region 7 is disposed closer to a breakdown voltage structure unit 102 than the n+ source region 6 is. The breakdown voltage structure unit 102 is a region that surrounds a periphery of the active region 101 and mitigates the electric field of the front surface of the base substrate to maintain the breakdown voltage.

A channel stopper includes a high concentration n+-type channel stopper region (a second first-conductivity-type semiconductor region) 17b and a low concentration n+-type channel stopper region (a first first-conductivity-type semiconductor region) 17a, which encompasses the n+-type channel stopper region 17b. The n+-type channel stopper region 17b and the n-type silicon carbide epitaxial layer 2 are separated from each other by the n+-type channel stopper region 17a. The impurity concentration of the n+-type channel stopper region 17a is higher than that of the n-type silicon carbide epitaxial layer 2. The n+-type channel stopper region 17a and the n+-type channel stopper region 17b are disposed on the opposite side (the side at the end of the n+-type silicon carbide substrate 1) of the breakdown voltage structure unit 102, with respect to an active region 101 side of the breakdown voltage structure unit 102. An end on the active region 101 side of the n+-type channel stopper region 17a (left end of the n+-type channel stopper region 17a) and an end on the opposite side (right end of a second p−-type region 5b, right end of the breakdown voltage structure unit 102) of the breakdown voltage structure unit 102, with respect to the active region 101 side of the breakdown voltage structure unit 102 are disposed away from each other by a predetermined distance (width L) through the n-type silicon carbide epitaxial layer 2.

A first conductivity type n well region 8 that penetrates the p-type base layer 4 in a depth direction and reaches the n-type silicon carbide epitaxial layer 2 is disposed in the p-type base layer 4, in a portion that is on the n-type silicon carbide epitaxial layer 2. The n well region 8 and the n-type silicon carbide epitaxial layer 2 constitute a drift region. Through a gate insulating film 9, a gate electrode 10 is disposed on the p-type base layer 4, on the surface of a portion that is between the n+ source region 6 and the n well region 8. The gate electrode 10 may be disposed on the surface of the n well region 8 through the gate insulating film 9.

Although only one MOS structure is depicted in the active region 101 in FIG. 1, plural MOS structures may be disposed.

An interlayer insulation film 11 is disposed on the overall surface of the front surface side of the silicon carbide semiconductor base substrate so as to cover the gate electrode 10. The source electrode 13 contacts the n+ source region 6 and the p+ contact region 7 through a contact hole opened in the interlayer insulation film 11. The source electrode 13 is electrically insulated from the gate electrode 10 by the interlayer insulation film 11.

An electrode pad 14 is disposed on the source electrode 13. An end of the electrode pad 14 extends on the interlayer insulation film 11 disposed in the breakdown voltage structure unit 102 and is terminated near the interface between the active region 101 and the breakdown voltage structure unit 102. A protective film 15 such as a passivation film made from, for example, polyimide is disposed on the breakdown voltage structure unit 102 so as to cover the end of the electrode pad 14. The protective film 15 has a function of preventing electric discharge.

In the breakdown voltage structure unit 102, a first p−-type region (a first conductivity type semiconductor region) 5a and the second p−-type region (a second conductivity type semiconductor region) 5b are disposed in a surface layer on the opposite side of the n-type silicon carbide epitaxial layer 2, with respect to the n+-type silicon carbide substrate 1 side of the n-type silicon carbide epitaxial layer 2. The first p−-type region 5a and the second p−-type region 5b constitute a double-zone JTE structure. The "double-zone JTE structure" is a JTE structure that has two p-type regions that are of respectively differing impurity concentrations and are disposed parallel to each other so as to contact.

The first p−-type region 5a is disposed contacting a periphery of the p+-type region 3 and surrounds the p+-type region 3. The second p−-type region 5b contacts a periphery of the first p−-type region 5a and surrounds the first p−-type region 5a. The p+-type region 3, the first p−-type region 5a, and the second p−-type region 5b are disposed parallel to each other in this sequence in a direction from the active region 101 side toward the breakdown voltage structure unit 102 side. The impurity concentration of the first p-type region 5a is lower than the impurity concentration of the p+-type region 3. The impurity concentration of the second p−-type region 5b is lower than the impurity concentration of the first p−-type region 5a.

FIGS. 2, 3, 4, 5, and 6 are cross-sectional views of the silicon carbide semiconductor device according to the embodiment in the course of manufacture. The method of manufacturing a silicon carbide semiconductor device according to the embodiment will be described taking an example of a case where, for example, a MOSFET of a 1,200-V breakdown voltage rating is produced.

Figure 2:
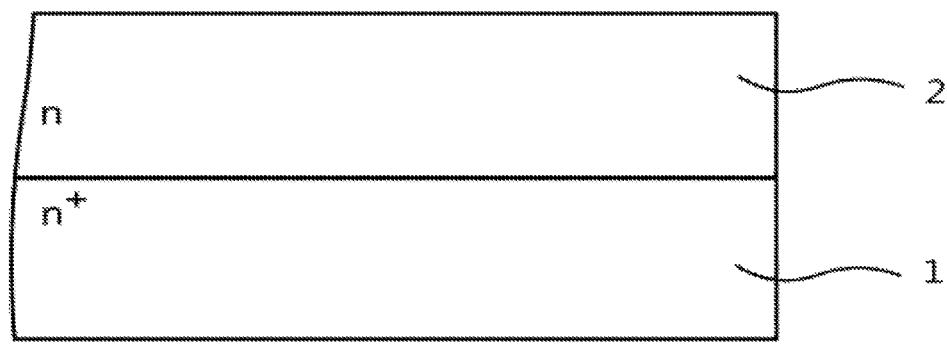
FIGS. 2, 3, 4, 5, and 6 are cross-sectional views of the silicon carbide semiconductor device according to the embodiment in the course of manufacture.

As depicted in FIG. 2, the n+-type silicon carbide substrate 1 is prepared in which nitrogen is doped at an impurity concentration of, for example, about $2 \times 10^{18}$ cm$^{-3}$. The principal surface of the n+-type silicon carbide substrate 1 may be, for example, a (000-1) plane that has an off angle of about 4 degrees in a <11-20> direction. The n-type silicon carbide epitaxial layer 2 in which nitrogen is doped at an impurity concentration of $1.0 \times 10^{16}$ cm$^{-3}$ is grown on the (000-1) plane of the n+-type silicon carbide substrate 1 to have a thickness of 10 μm.

Figure 3:
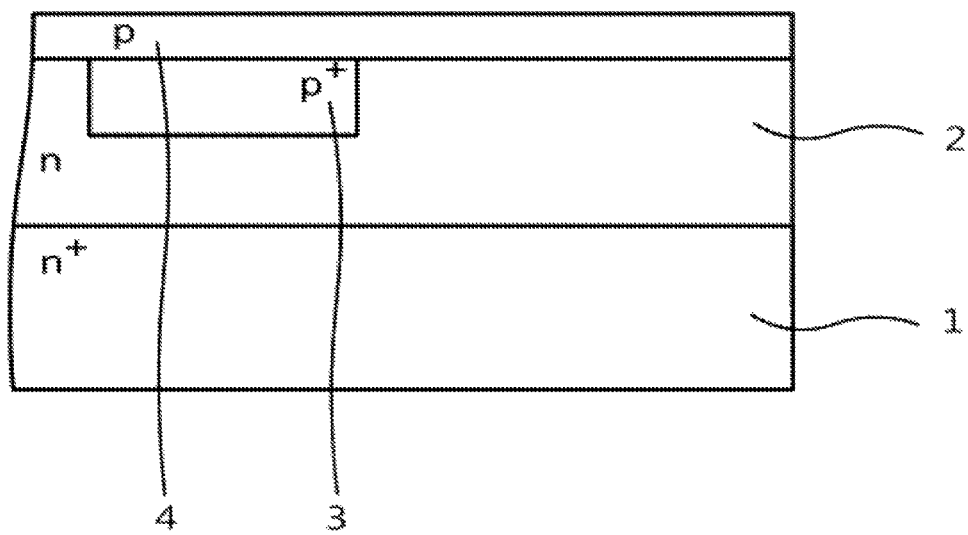

As depicted in FIG. 3, a photolithography process and ion implantation are executed to selectively form the p+-type region 3 in the surface layer of the n-type silicon carbide epitaxial layer 2. The p+-type region 3 is formed by doping, for example, aluminum.

A p-type silicon carbide epitaxial layer forming the p-type base layer 4 is grown to have a thickness of, for example, 0.5 μm on the surface of the n-type silicon carbide epitaxial layer 2. The p-type base layer 4 is completed by implantation of, for example, aluminum. In this case, a p-type silicon carbide epitaxial layer in which aluminum (Al) is doped may be grown so that the p-type base layer 4 has an impurity concentration of, for example, $8.0 \times 10^{15}$ cm$^{-3}$.

Figure 4:
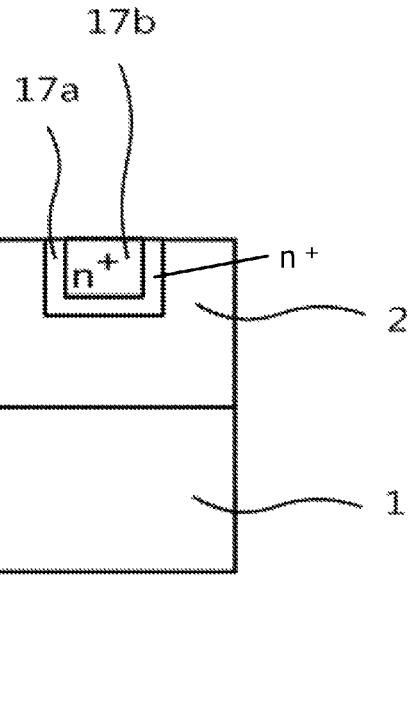

As depicted in FIG. 4, the p-type base layer 4 on the breakdown voltage structure unit 102 is removed to a depth of, for example, 0.7 μm by etching to expose the n-type silicon carbide epitaxial layer 2. An oxide film is deposited on the front surface of the silicon carbide semiconductor base substrate. The oxide film is selectively removed using photolithography and etching to expose a portion that corresponds to the region for the n$^+$-type channel stopper region 17a to be formed therein. Ion implantation is executed using the remaining portion of the oxide film (hereinafter, referred to as "oxide film mask") as a mask to form the n$^+$-type channel stopper region 17a in the surface layer of the n-type silicon carbide epitaxial layer 2 exposed in the breakdown voltage structure unit 102. In this ion implantation, for example, phosphorus (P) may be used as the dopant and the dose amount may be set such that the impurity concentration of the n$^+$-type channel stopper region 17a is $3.0 \times 10^{17}$ cm$^{-3}$.

An oxide film is further deposited on the oxide film mask used to selectively form the n$^+$-type channel stopper region 17a. The thickness of the additionally deposited oxide film may be, for example, 0.1 μm. An oxide mask is thereby formed that has an opening smaller than the n$^+$-type channel stopper region 17a by 0.2 μm (0.1 μm on each one side).

The n$^+$-type channel stopper region 17b is selectively formed inside the n$^+$-type channel stopper region 17a to be surrounded by the n$^+$-type channel stopper region 17a, using the remaining portion of the oxide film (the oxide film mask) and by ion implantation. In this ion implantation, for example, phosphorus may be used as the dopant and the dose amount may be set such that the impurity concentration of the n$^+$-type channel stopper region 17b is $3.0 \times 10^{20}$ cm$^{-3}$. The impurity concentration of the n$^+$-type channel stopper region 17a may be 0.1 times the impurity concentration of the n$^+$-type channel stopper region 17b or less. The width of the n$^+$-type channel stopper region 17a that separates the n$^+$-type channel stopper region 17b and the n-type silicon carbide epitaxial layer 2 from each other may be 0.1 μm or greater.

Figure 5:
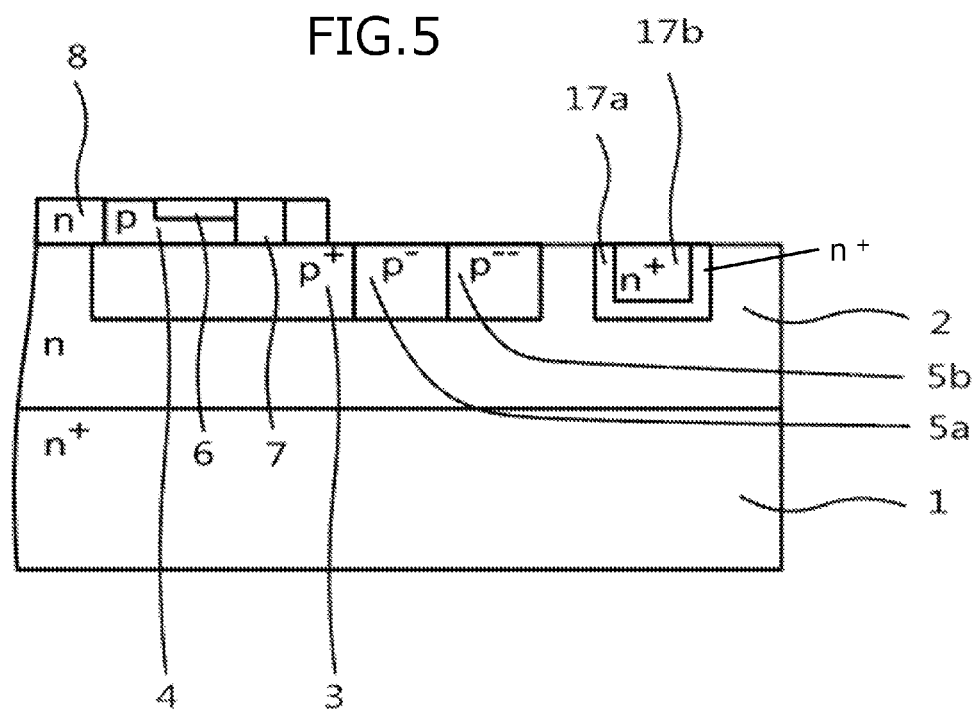

As depicted in FIG. 5, the first p-type region 5a is selectively formed by a photolithography process and ion implantation in the surface layer of the n-type silicon carbide epitaxial layer 2 exposed by the etching. In this ion implantation, for example, aluminum may be used as the dopant and the dose amount may be set to be $2.0 \times 10^{13}$ cm$^{-2}$. The second p$^-$-type region 5b is selectively formed by a photolithography process and ion implantation in the surface layer of the n-type silicon carbide epitaxial layer 2 exposed by the etching. The impurity concentration of the second p$^-$-type region 5b is set to be lower than that of the first p$^-$-type region 5a. In this ion implantation, for example, aluminum may be used as the dopant and the dose amount may be set to be $1.0 \times 10^{13}$ cm$^{-2}$.

The n well region 8 is selectively formed by inverting the conductivity type of the portion on the n-type silicon carbide epitaxial layer 2 of the p-type base layer 4 by executing a photolithography process and ion implantation. In this ion implantation, for example, phosphorus is used as the dopant and the dose amount may be set such that the impurity concentration of the n well region 8 is $2.0 \times 10^{16}$ cm$^{-3}$. The width and the depth of the n well region 8 may be 2.0 μm and 0.6 μm, respectively.

The n$^+$ source region 6 is selectively formed by photolithography and ion implantation in the surface layer of the p-type base layer 4, at portion on the p$^+$-type region 3. The p$^+$ contact region 7 is selectively formed by photolithography and ion implantation in the surface layer of the n-type silicon carbide epitaxial layer 2 at the portion of the p-type base layer 4 on the p$^+$-type region 3.

Heat treatment (annealing) is executed to activate the n$^+$-type channel stopper region 17a, the n$^+$-type channel stopper region 17b, the p$^+$-type region 3, the n$^+$ source region 6, the p$^+$ contact region 7, the n well region 8, the first p-type region 5a and the second p-type region 5b. The temperature of the heat treatment and the time period of the heat treatment in this case may be, for example, 1,620 degrees C. and two minutes, respectively.

The order may variously be changed to form the n$^+$-type channel stopper region 17a, the n$^+$-type channel stopper region 17b, the p$^+$-type region 3, the n$^+$ source region 6, the p$^+$ contact region 7, the n well region 8, the first p$^-$-type region 5a, and the second p$^-$-type region 5b.

Figure 6:
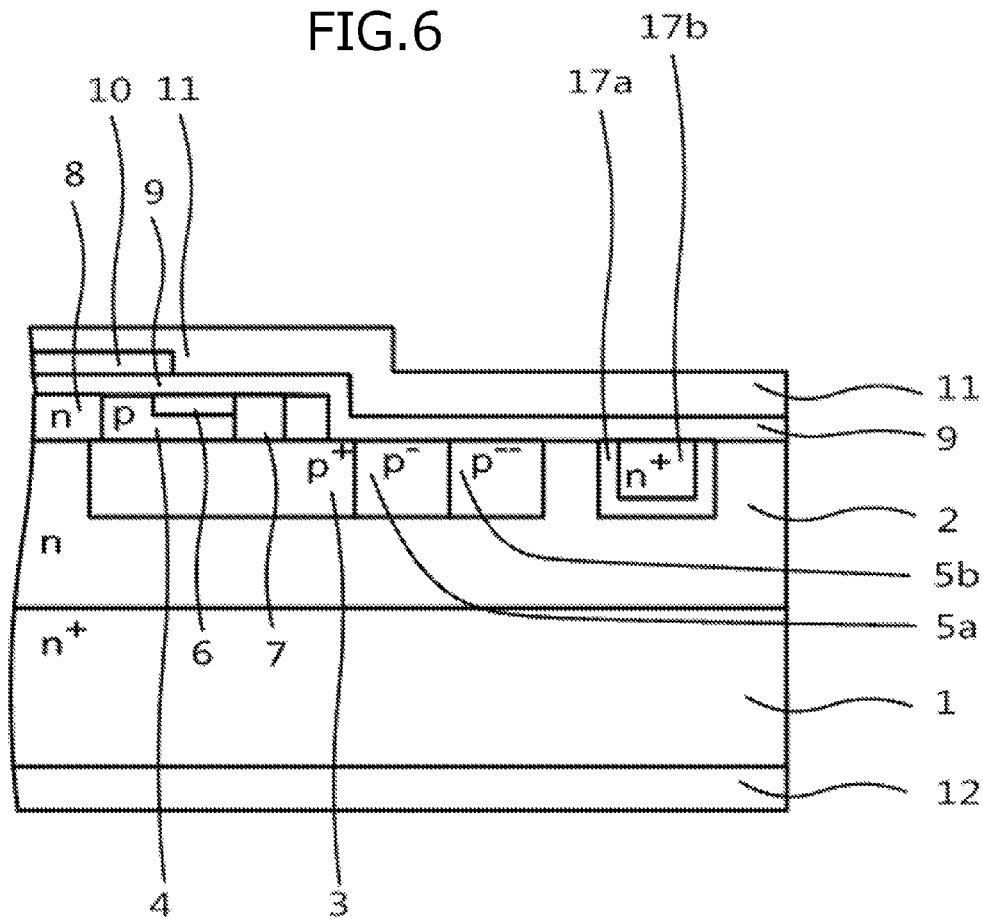

As depicted in FIG. 6, the gate insulating film 9 is formed to have a thickness of 100 nm by thermally oxidizing the front surface of the silicon carbide semiconductor base substrate. This thermal oxidation may be executed using heat treatment at a temperature of about 1,000 degrees C. in an oxygen atmosphere. The p-type base layer 4 and the regions formed in the surface of the n-type silicon carbide epitaxial layer 2 are thereby covered with the gate insulating film 9.

A polysilicon layer in which, for example, phosphorus (P) is doped is formed as the gate electrode 10, on the gate insulating film 9. The polysilicon layer is patterned and is selectively removed so that the polysilicon layer remains on a portion of the p-type base layer 4, between the n$^+$ source region 6 and the n well region 8. In this case, the polysilicon layer may be left on the n well region 8.

For example, Non-doped Silicate Glass (NSG) is deposited to have a thickness of 1 μm as the interlayer insulation film 11 so as to cover the gate electrode 10. The portion corresponding to the n$^+$ source region 6 and the p$^+$ contact region 7 of the interlayer insulation film 11 and the gate insulating film 9 is selectively removed by patterning to form the contact hole to expose the n$^+$ source region 6 and the p$^+$ contact region 7. Heat treatment (reflowing) is executed to flatten the interlayer insulation film 11.

The source electrode 13 is deposited on the surface of the interlayer insulation film 11. In this case, the source electrode 13 is embedded also in the contact hole to bring the n$^+$ source region 6 and the p$^+$ contact region 7 into contact with the source electrode 13. The contact portion (a contact) between the n$^+$ source region 6 and the p$^+$ contact region 7, and the source electrode 13 constitutes an ohmic junction. The source electrode 13 on the breakdown voltage structure unit 102 and the active region 101 is selectively removed excluding that in the contact hole.

A film of, for example, nickel (Ni) is deposited as the back surface electrode 12 on the surface of the n$^+$-type silicon carbide substrate 1 (the back surface of the silicon carbide semiconductor base substrate). Heat treatment is executed at a temperature of, for example, 970 degrees C. to form an ohmic junction between the n$^+$-type silicon carbide substrate 1 and the back surface electrode 12. The electrode pad 14 is deposited on the overall surface of the front surface of the silicon carbide semiconductor base substrate to cover the source electrode 13 and the interlayer insulation film 11 of the active region 101 by, for example, a sputtering method. The thickness of the portion of the electrode pad 14 on the interlayer insulation film 11 may be, for example, 5 μm. The electrode pad 14 may be formed using, for example, aluminum (Al). The electrode pad 14 is selectively removed. In the breakdown voltage structure 102, the protective film 15 is formed on the front surface of the silicon carbide semiconductor base substrate so as to cover the end of the electrode pad 14.

Films of, for example, titanium (Ti), nickel, and gold (Au) are formed in this sequence in the surface of the back surface electrode 12, as the back surface electrode pad 16. The MOSFET depicted in FIG. 1 is thereby completed.

A difference in the leak current is evaluated between a case where at the step of forming the channel stopper, the $n^+$-type channel stopper region 17b is formed to be surrounded by the $n^+$-type channel stopper region 17a as an example (FIG. 1) and a case where the channel stopper is formed only by a high concentration $n^+$-type channel stopper region 17 as a comparative example (FIG. 7). FIG. 7 is a cross-sectional view of the configuration of the comparative example of the silicon carbide semiconductor device according to the embodiment. The concentration of the $n^+$-type channel stopper region 17b of the example and that of the high concentration $n^+$-type channel stopper region 17 of the comparative example are equal to each other.

The width L from the end on the channel stopper side of the breakdown voltage structure 102 to the end on the breakdown voltage structure 102 side of the $n^+$-type channel stopper region 17a of the example (see FIG. 1) and the width from the end on the channel stopper side of the breakdown voltage structure 102 to the end on the breakdown voltage structure 102 side of the $n^+$-type channel stopper region 17 of the comparative example are each 10 μm.

FIG. 8 is a chart of frequency distributions of the leak current value of the example and the comparative example. The horizontal represents the current value and the vertical represents a count of verified specimens. The potential of each of the source electrode 13 and the gate electrode 10 was set to be zero V and plural measurement sessions were conducted for the leak current resulting when a voltage of 1,200 V is applied to the back surface electrode pad 16 to obtain the frequency distribution (the histogram) of the leak current values.

As can be seen in FIG. 8, in the semiconductor device of the comparative example, the elements for which the leak current was on the order of $1.0 \times 10^{-7}$ amperes were greatest in number while in the semiconductor device of the example, the elements for which the leak current was on the order of $1.0 \times 10^{-9}$ amperes were greatest in number, confirming that the leak current improved.

FIG. 9 is a chart of the mode values of the leak current when the interval between the breakdown voltage structure and the channel stopper is varied for the example and the comparative example. The width L between the end on the channel stopper side of the breakdown voltage structure 102 and the end on the breakdown voltage structure 102 side of the $n^+$-type channel stopper region 17a of the example, and the width between the end on the channel stopper side of the breakdown voltage structure 102 and the end on the breakdown voltage structure 102 side of the channel stopper region 17 of comparative example were varied, respectively. In this case, the relation of the mode values of the leak current that was obtained when the potential of each of the source electrode 13 and the gate electrode 10 was set to be zero V and a voltage of 1,200 V was applied to the back surface electrode pad 16 was checked. As a result, as depicted in FIG. 9, according to the structure of the example, it was confirmed that the leak current could be suppressed compared to that of the comparative example and in particular, the effect became more conspicuous as the interval L became smaller.

As described, according to the present invention, for the structure of the channel stopper, a region whose impurity concentration is a low concentration surrounds the periphery of a region whose impurity concentration is a high concentration and a concentration gradient is thereby formed to reduce misfit dislocation of the crystal. Thus, leaks due to the crystal defect can be suppressed and a high breakdown voltage and low leakage can be realized.

In the embodiment, the present invention has been described taking an example of a case where the principal surface of the $n^+$-type silicon carbide substrate 1 is set to be the was checked plane and the MOS is produced on the (000-1) plane while the present invention is not limited hereto and various changes can be made such as a change of the orientation of the substrate principal surface.

Although the MOS structure has been described as the element structure, the present invention may be applied to each of various structures such as an SBD structure and a pn diode structure.

Although the double zone JTE structure has been described as the breakdown voltage structure, the present invention may be applied to a multi-zone JTE structure configured to include three or more p-type regions of mutually differing impurity concentrations and disposed parallel to each other so as to contact, and a termination structure configured to include plural p-type regions disposed at predetermined intervals like an FLR structure regardless of the degree of difficulty of the fabrication. In each of the embodiments, although the first conductivity type is set to be the n type and the second conductivity type is set to be the p type, the present invention is further applicable when the first conductivity type is set to be the p type and the second conductivity type is set to be the n type.

According to the configuration, as to the structure of the channel stopper, the region whose impurity concentration is the low concentration surrounds the periphery of the region whose impurity concentration is the high concentration and a concentration gradient is thereby formed to thereby reduce any misfit dislocation of the crystal. Any leak due to the crystal fault can thereby be suppressed and a high breakdown voltage and a low leak can be realized. Any influence of the fabrication apparatus tends to be avoided and the yield can be improved.

According to the present invention, high breakdown voltage and low electric current leak can be realized.

As described, the semiconductor device and the method of manufacturing a semiconductor device according to the present invention are useful for high voltage semiconductor devices used in electric power converting equipment and a power supply devices such as those for various industrial machines, and are especially suitable for high voltage semiconductor devices using a wide band gap semiconductor and adapted as a high voltage semiconductor.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device comprising:
   a semiconductor substrate of a first conductivity type and comprising silicon carbide;

a deposited semiconductor layer of the first conductivity type and deposited on a surface of the semiconductor substrate, the first deposited semiconductor layer comprising silicon carbide and an impurity concentration that is lower than that of the semiconductor substrate;

a first second-conductivity-type semiconductor region selectively disposed in a surface layer of a first side of the first deposited semiconductor layer opposite a second side, the second side facing the semiconductor substrate;

an element structure that comprises at least the first second-conductivity-type semiconductor region and a metal layer forming a metal-semiconductor junction on the first deposited semiconductor layer;

a second second-conductivity-type semiconductor region that surrounds a periphery of the element structure; and a first conductivity type semiconductor region that surrounds a periphery of the second second-conductivity-type semiconductor region so that the first deposited semiconductor layer is between the first conductivity type semiconductor region and the second second-conductivity-type semiconductor region, wherein the first conductivity type semiconductor region has a first first-conductivity-type semiconductor region that encompasses a second first-conductivity-type semiconductor region of a high impurity concentration and separates the second first-conductivity-type semiconductor region and the first deposited semiconductor layer from each other, and the first first-conductivity-type semiconductor region has an impurity concentration that is higher than that of the first deposited semiconductor layer and is at most 0.1 times the impurity concentration of the second first-conductivity-type semiconductor region.

2. The semiconductor device according to claim 1, wherein a width of the first first-conductivity-type semiconductor region separating the second second-conductivity-type semiconductor region and the first deposited semiconductor layer from each other is at least 0.1 μm.

3. The semiconductor device according to claim 1, wherein the metal film forms a Schottky junction with the first deposited semiconductor layer.

4. The semiconductor device according to claim 1, further comprising a second deposited semiconductor layer of a second conductivity type and selectively deposited on the first deposited semiconductor layer, wherein the metal film forms an ohmic junction with the second deposited semiconductor layer.

5. The semiconductor device according to claim 1, wherein the element structure comprises a base region of a second conductivity type and comprising a second deposited semiconductor layer of a second conductivity type, the base region covering a portion of the first second-conductivity-type semiconductor region and having an impurity concentration that is lower than that of the first second-conductivity-type semiconductor region;

a source region of the first conductivity type and selectively disposed inside the base region;

a well region of the first conductivity type and penetrating the base region in a depth direction so as to reach the first deposited semiconductor layer;

a gate electrode that is disposed through a gate insulating film, on a surface of the base region, at a portion between the source region and the well region; and a source electrode that comprises the base region and the metal film that contacts the source region.

6. The semiconductor device according to claim 1, wherein the semiconductor substrate comprises silicon carbide.

7. The semiconductor device according to claim 1, wherein a crystallographic plane of the semiconductor substrate is a plane parallel to a (000-1) plane or a plane inclined with respect to the (000-1) plane, at an angle that is at most 10 degrees.

8. A method of manufacturing a semiconductor device, comprising:

depositing a first deposited semiconductor layer on a surface of a semiconductor substrate;

forming a first second-conductivity-type semiconductor region in a surface layer of a first side of the first deposited semiconductor layer opposite a second side, the second side facing the semiconductor substrate;

forming an element structure that comprises at least the first second-conductivity-type semiconductor region and a metal layer forming a metal-semiconductor junction on the first deposited semiconductor layer;

forming a second second-conductivity-type semiconductor region that surrounds a periphery of the element structure; and selectively forming a first conductivity type semiconductor region that surrounds a periphery of the second second-conductivity-type semiconductor region so that the first deposited semiconductor layer is between the first conductivity type semiconductor region and the second second-conductivity-type semiconductor region, wherein selectively forming the first conductivity type semiconductor region includes forming a first first-conductivity-type channel stopper region that has an impurity concentration that is higher than that of the first deposited semiconductor layer, the first first-conductivity-type channel stopper region being formed in a surface layer of the first deposited semiconductor layer, at an outer side of a breakdown voltage structure unit that surrounds an active region that bears driving current, selectively forming the first conductivity type semiconductor region includes forming a second first-conductivity-type channel stopper region that has an impurity concentration that is at least 10 times that of the first first-conductivity-type channel stopper region, the second first-conductivity-type channel stopper region being formed inside the first first-conductivity-type channel stopper region so as to be encompassed by the first first-conductivity-type channel stopper region, the semiconductor substrate comprises silicon carbide, and the first deposited semiconductor layer comprises silicon carbide and an impurity concentration that is lower than that of the semiconductor substrate.

* * * * *